US010701838B1

(12) United States Patent
Conroy et al.

(10) Patent No.: US 10,701,838 B1
(45) Date of Patent: Jun. 30, 2020

(54) SELF-INSTALLING CONNECTIONS FOR RACK LIQUID COOLING

(71) Applicant: Amazon Technologies, Inc., Seattle, WA (US)

(72) Inventors: Ryan F. Conroy, Seattle, WA (US); Felipe Enrique Ortega Gutierrez, Tacoma, WA (US); Luke Thomas Gregory, Mercer Island, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 16/363,165

(22) Filed: Mar. 25, 2019

(51) Int. Cl.
*H05K 7/20* (2006.01)
*F16L 21/00* (2006.01)
*F16K 25/00* (2006.01)
*F15D 1/00* (2006.01)
*F16L 33/16* (2006.01)
*F16L 17/025* (2006.01)

(52) U.S. Cl.
CPC ..... *H05K 7/20763* (2013.01); *H05K 7/20272* (2013.01); *F16L 17/025* (2013.01); *F16L 33/16* (2013.01); *F16L 2201/40* (2013.01)

(58) Field of Classification Search
CPC ......... B60H 1/32; B60H 1/00571; B60S 1/52; F28D 7/103; F28D 15/043; F28D 1/047; F28D 7/1669; F28D 7/1684; F28D 9/0025; F28D 9/0031; F28D 9/0043; F28D 9/0062; F28F 2210/02; F28F 13/08; F28F 1/40; F28F 1/422; F28F 9/0246; F28F 9/0248; H05K 1/0203; H05K 5/064; H05K 7/20763; H05K 7/20272; H05K 7/20781; F15D 1/02; F15D 1/14; F16L 41/18; F16L 55/105; F16L 55/46; F16L 17/025; F16L 33/16; F16L 2201/40
See application file for complete search history.

(56) References Cited

U.S. PATENT DOCUMENTS 10,039,206 B1 * 7/2018 Wishman ............. H05K 7/1492
10,309,864 B1 * 6/2019 Lee ......................... G01M 3/40
2004/0221604 A1 * 11/2004 Ota ..................... H05K 7/20781
62/259.2

(Continued)

*Primary Examiner* — Jayprakash N Gandhi
*Assistant Examiner* — Michael A Matey
(74) *Attorney, Agent, or Firm* — Kilpatrick Townsend & Stockton LLP

(57) ABSTRACT

A self-installing connector for a liquid cooling system of a datacenter component rack system. A datacenter component rack may include manifolds for conveying coolant to or from one or more datacenter electronic components for liquid cooling components of the datacenter electronic component. The self-installing connector provides a fluid connection between the manifold and a liquid cooling system of a datacenter electronic component. The self-installing connector may puncture the manifold at the time the datacenter electronic component is installed. The self-installing connector may form an opening in the manifold and secure one end of the self-installing connector into the opening upon installation of the datacenter electronic component into the datacenter component rack. The self-installing connector can separate at a dripless quick-disconnect coupling for datacenter electronic component maintenance.

19 Claims, 4 Drawing Sheets

(56) References Cited

U.S. PATENT DOCUMENTS

| | | | |
|---|---|---|---|
| 2010/0002393 A1* | 1/2010 | Campbell | H05K 7/20772 361/699 |
| 2011/0313576 A1* | 12/2011 | Nicewonger | F28D 15/00 700/282 |
| 2013/0025818 A1* | 1/2013 | Lyon | H05K 7/20781 165/11.1 |
| 2013/0312846 A1* | 11/2013 | Eriksen | F16L 37/34 137/315.01 |
| 2013/0312854 A1* | 11/2013 | Eriksen | F28F 19/00 137/544 |
| 2014/0202678 A1* | 7/2014 | Goth | H05K 7/20772 165/287 |
| 2014/0240920 A1* | 8/2014 | Cox | G06F 1/20 361/679.53 |
| 2015/0208549 A1* | 7/2015 | Shedd | H05K 7/20327 165/104.27 |
| 2015/0283658 A1* | 10/2015 | Ellsworth, Jr. | H02G 15/22 29/592.1 |
| 2016/0113149 A1* | 4/2016 | Krug, Jr. | H05K 7/20781 361/679.53 |
| 2016/0341342 A1* | 11/2016 | Arvelo | H05K 7/20272 |
| 2017/0257980 A1* | 9/2017 | Fukunaga | H01R 13/005 |
| 2018/0132387 A1* | 5/2018 | So | H05K 7/20781 |
| 2018/0242478 A1* | 8/2018 | Cui | H05K 7/20772 |
| 2018/0279510 A1* | 9/2018 | Johnson | H05K 7/20772 |
| 2018/0303007 A1* | 10/2018 | Gao | H05K 7/20781 |

* cited by examiner

SELF-INSTALLING CONNECTIONS FOR RACK LIQUID COOLING

BACKGROUND

A datacenter typically contains a collection of datacenter electronic components such as computer servers and components for the management, operation and connectivity of those datacenter electronic components. Even in isolation, these datacenter electronic components may generate sufficient heat that temperature management is important for prolonging the life of the datacenter electronic components and ensuring smooth and continuous operation of the datacenter. Typically, such datacenter electronic components are installed equipped with onboard cooling equipment, such as heat sinks and fans or even liquid cooling systems attached to components that produce the most heat, like processors.

Datacenter electronic components are often arranged together. For example, datacenter electronic components can be vertically arranged in racks or within cabinets. Datacenter cooling systems often include air cooling of individual datacenter electronic components, for example by circulating air through the casings of respective rack-mounted datacenter electronic components. Alternatively, or in combination with air cooling, heat rejection of rack-mounted datacenter electronic components can be achieved by direct liquid cooling of components of the datacenter electronic components.

BRIEF DESCRIPTION OF THE DRAWINGS

Various embodiments in accordance with the present disclosure will be described with reference to the drawings, in which.

DETAILED DESCRIPTION

Figure 1:
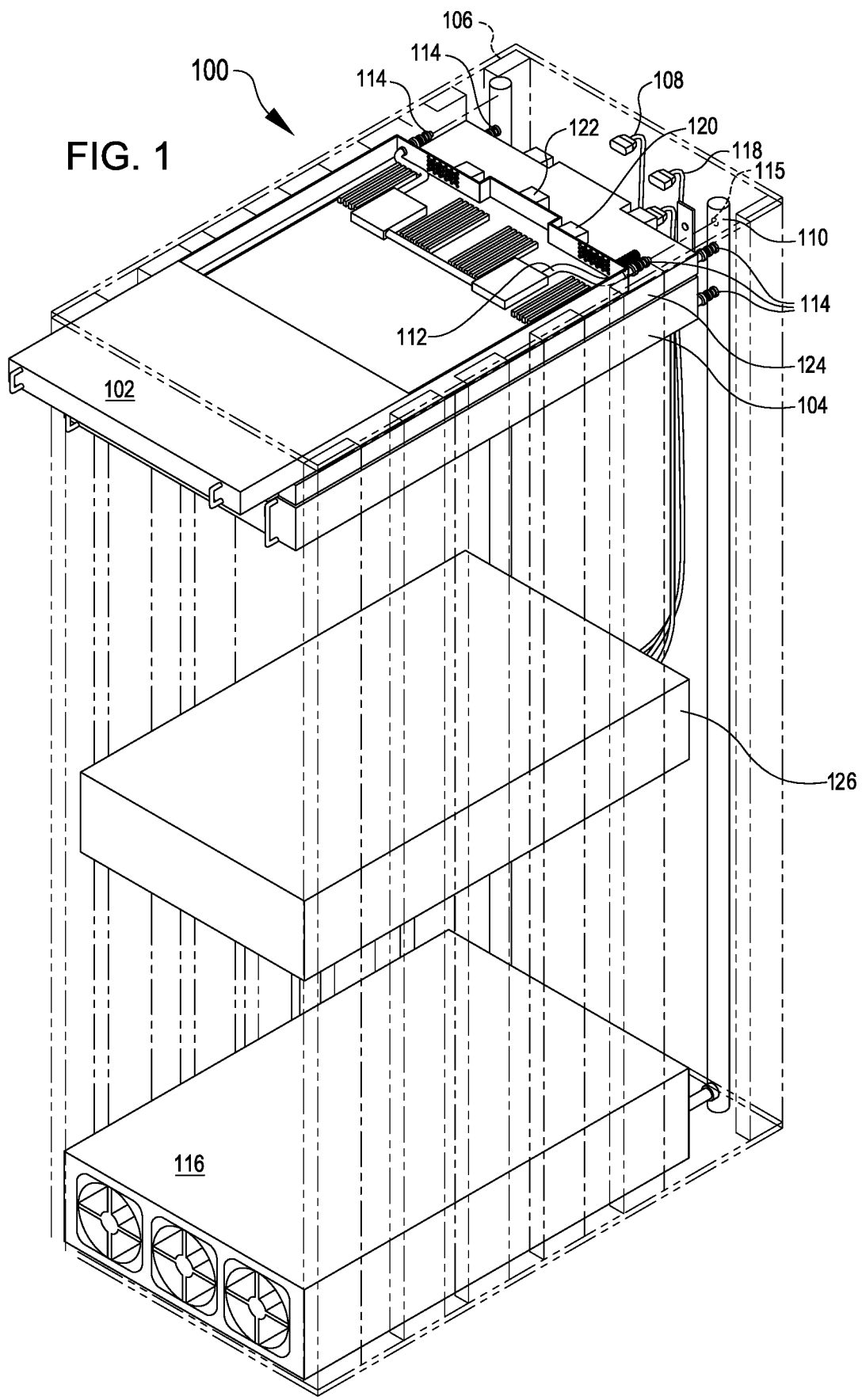
FIG. 1 is a partial perspective view of a datacenter component rack and associated components illustrating an example environment for implementing a self-installing connector in accordance with embodiments.

Embodiments and techniques described herein are directed to self-installing connectors for liquid cooling, which are configured to self-install in a structure such as a coolant supply manifold. When installed, the self-installing connector provides a fluid connection between a manifold of a cooling system built into and/or included with a datacenter component rack and a datacenter electronic component installed on the datacenter component rack. The self-installing connector is designed to puncture the manifold as the datacenter electronic component is installed into a slot of the datacenter component rack. As the self-installing connector is installed, a manifold coupling of the self-installing connector is embedded in the manifold. The component coupling of the self-installing connector is permanently and/or securely attached to the datacenter electronic component. The component coupling and the manifold coupling are coupled together through a quick-disconnect coupling. After the manifold coupling has been embedded in the manifold, the quick-disconnect coupling allows the component coupling and the electronic equipment to be retracted from the datacenter component rack for maintenance and/or other operations and easily re-installed without requiring a separate action by the installer to couple the liquid cooling system. In other words, installation of the datacenter electronic component into the datacenter component rack also simultaneously accomplishes installation of a quick-disconnect coupling between the datacenter electronic component and the datacenter component rack liquid cooling system.

Because embodiments described herein allow installation of datacenter electronic components via puncturing of a manifold, the datacenter electronic components can be installed at varying non-uniform and/or random positions along the height of the datacenter component rack. In some examples, the datacenter component rack may be configured to receive datacenter electronic components of varying sizes for example as measure in rack units (RU), including but not limited to heights of 1 unit (1 RU), ½ unit (0.5 RU), and larger heights, or to receive irregularly-sized datacenter electronic components. At least some prior datacenter component racks included a regular spacing of quick-disconnect connectors extended from a manifold, each spaced to receive a single datacenter electronic component. In cases where electronic components of mixed heights are installed in the same rack, only a portion of the quick-disconnect connectors might be used. Techniques of the present disclosure may result in cost savings by reducing or eliminating unused connectors in the rack.

In the description herein, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the example being described.

FIG. 1 illustrates a partial perspective view of a datacenter component rack and associated components illustrating an example environment for using a self-installing connector in accordance with embodiments. The datacenter component rack system 100 includes a datacenter component rack 106 designed to accommodate a plurality of datacenter electronic components. The datacenter component rack 106 may be designed to accept datacenter electronic components at varying locations, heights, and/or of varying sizes. In the example shown in FIG. 1, at least two different sizes of datacenter electronic components are displayed. For instance, a datacenter electronic component 102 located at a top of the datacenter component rack 106 is of a first size, which may be sized according to a rack unit (RU) size system to be any size, such as ½ RU and/or 1 RU. A datacenter electronic component 124 is shown which may be of the same size or RU as the datacenter electronic component 102 or may be of a different size. A datacenter electronic component 104 is shown having a larger size, such as 1½ RU or 2 RU. Other electronic datacenter components 126 may have larger sizes in according to some examples and/or be distributed vertically throughout the datacenter component rack 106. Other datacenter electronic components (not shown) may be installed in the datacenter component rack 106. The datacenter electronic components 102, 104, and 124 may be distributed at any height along the datacenter component rack 106 and still capable of connecting to one or more manifolds 110 used for transporting liquid for cooling the datacenter electronic components 102, 104, and 124. For example, one manifold 110 may be a delivery manifold, while the other manifold may be a return manifold 110, i.e., one manifold 110 may be for hot or heated coolant returning to a heat exchanger 116 from the datacenter electronic components 102, 104, and 124, and a second manifold 110 may be for a cold line, coolant exiting the heat exchanger 116 to be used for cooling the datacenter electronic components 102, 104, and 124. The data center electronic components may be, for example, servers, JBODs, network switches, automatic transfer switches (ATSes), power distribution units (PDUs), or any other electronic equipment that is mountable in a server rack.

Manifolds 110 can be disposed on and/or in the datacenter component rack 106. The manifold(s) 110 connect to a heat exchanger 116. The heat exchanger 116 may be part of the datacenter component rack system 100 or may be positioned remotely of the datacenter component rack system 100 and connected to the manifolds through pipes and/or tubing (not shown). The heat exchanger 116 circulates coolant through the datacenter component rack system 100 in addition to transferring heat from the coolant to the environment or some other location. The manifolds 110 may be made of a non-corrosive material such as stainless steel to reduce contamination to the coolant within the manifolds 110 and extend the life of the manifolds 110. In some other examples, the manifolds 110 may be made of a non-reactive plastic tubing e.g., cross-linked polyethylene (PEX) tubing, a copper tubing, a brass tubing, and/or other such material. In some examples, the manifold 110 may be a composite of multiple materials, such as a stainless steel tube having a membrane or thinned portion formed from PEX through which the self-installing connector 114 may puncture more easily than through stainless steel. For instance, the manifold 110 may have a non-uniform wall thickness, with a wall thickness in a portion of the manifold 110 facing and/or directed towards the datacenter electronic component 102 and/or positioned to contact the self-installing connector 114 thinner than a remainder of the wall thickness. This results in a manifold 110 which may be punctured by the self-installing connector 114 with less effort.

The datacenter component rack system 100 includes data connections 118 as well as a power trunk 108. The data connections 118 include connectors to interface with the datacenter electronic components 102, 104, and 124 at data ports 120 (e.g., FIG. 2) and provide a conduit for transmitting data in accordance with the function of the datacenter electronic components 102, 104, and 124. Suitable examples of types of the data connections 118 may include pluggable optical transceivers (such as small form-factor pluggable (SFP), enhanced small form-factor pluggable (SFP+), compact small form-factor pluggable (CSFP), or other variations such as QSFP, QSFP+, QSFP28, QSFP56, QSFP56-DD, or OSFP), interconnect interfaces (such as Ultra path Interconnect (UPI), peripheral component interconnect express (PCIE), an RJ45 connector type or a similar connector type, or a connector sized and arranged to meet any other suitable standards that may be known in the art. The power trunk 108 includes electrical connections to interface with the datacenter electronic components 102, 104, and 124 and specifically with electrical connections 122 (e.g., FIG. 2) to provide electrical power to the datacenter electronic components 102, 104, and 124. The power trunk 108 may be adjustable and/or include connections that allow the varying sizes and positioning of datacenter electronic components 102, 104, and 124 described herein.

The datacenter electronic components 102, 104, and 124 include a liquid cooling system 112 which uses a coolant to remove heat from components, such as processors, of the datacenter electronic components 102, 104, and 124 to prevent overheating and damage to the components. The liquid cooling system 112 includes tubing and may include passive heat exchangers and/or heat sinks through which coolant flows to remove heat from the datacenter electronic components 102, 104, and 124. At the rear of the datacenter electronic components 102, 104, and 124, the liquid cooling system 112 terminates at self-installing connectors 114 (e.g., FIG. 2) which couple the liquid cooling system 112 to the manifolds 110.

The self-installing connector 114 may initially be connected to a datacenter electronic component 102 before the component 102 is placed into the rack 106. The self-installing connector 114 includes two couplings, a component coupling 154 and a manifold coupling 140. After installation, the component coupling 154 will remain connected to the datacenter electronic component 102 while the manifold coupling 140 will be connected to the manifold 110 and the manifold coupling 140 and the sever coupling 154 may disconnect from the manifold coupling 140 if the datacenter electronic component 102 is removed from the datacenter component rack. At the connection of the two couplings, the self-installing connector includes a dripless quick-disconnect coupling. Both couplings of the self-installing connector 114 are initially, prior to installation of the datacenter electronic components 102, 104, and 124 into the datacenter component rack 106, attached to the rear of the datacenter electronic components 102, 104, and 124. As the datacenter electronic component 102 is installed into the datacenter component rack 106, the self-installing connector 114 comes into contact with the manifold 110. The self-installing connector 114 punctures the manifold 110 and is pushed into the manifold 110 as the datacenter electronic component 102 is seated in a final installed position in the datacenter component rack 106. After installation of the datacenter electronic component 102, the self-installing connector 114 may disconnect at the quick-disconnect coupling when the datacenter electronic component 102 is removed from the installed position for maintenance and/or other work. The self-installing connector 114 is described in further detail with respect to FIG. 3 below.

Figure 2:
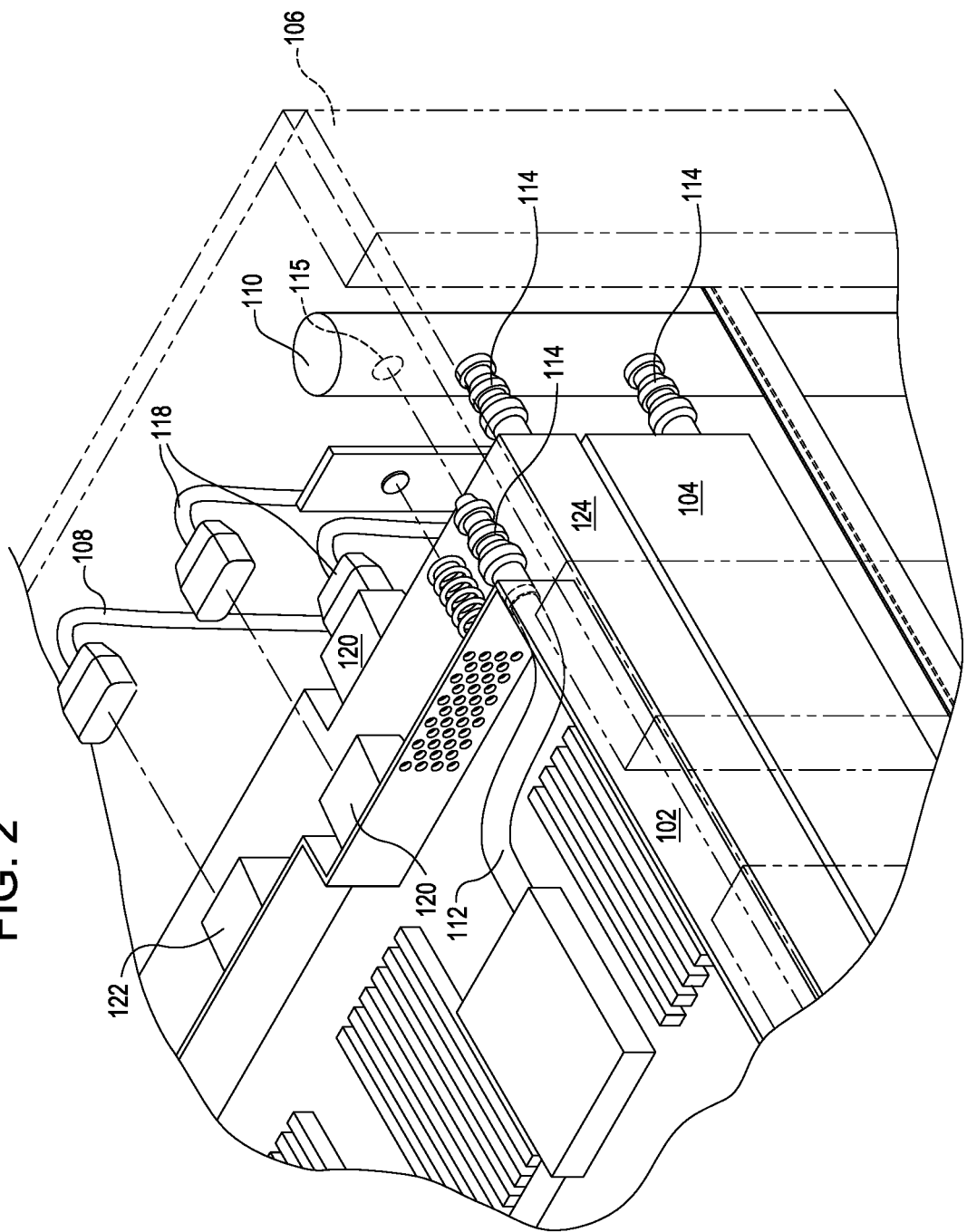
FIG. 2 illustrates a detail view of a rear portion of the datacenter component rack and components of FIG. 1 showing self-installing connectors.
Figure 4:
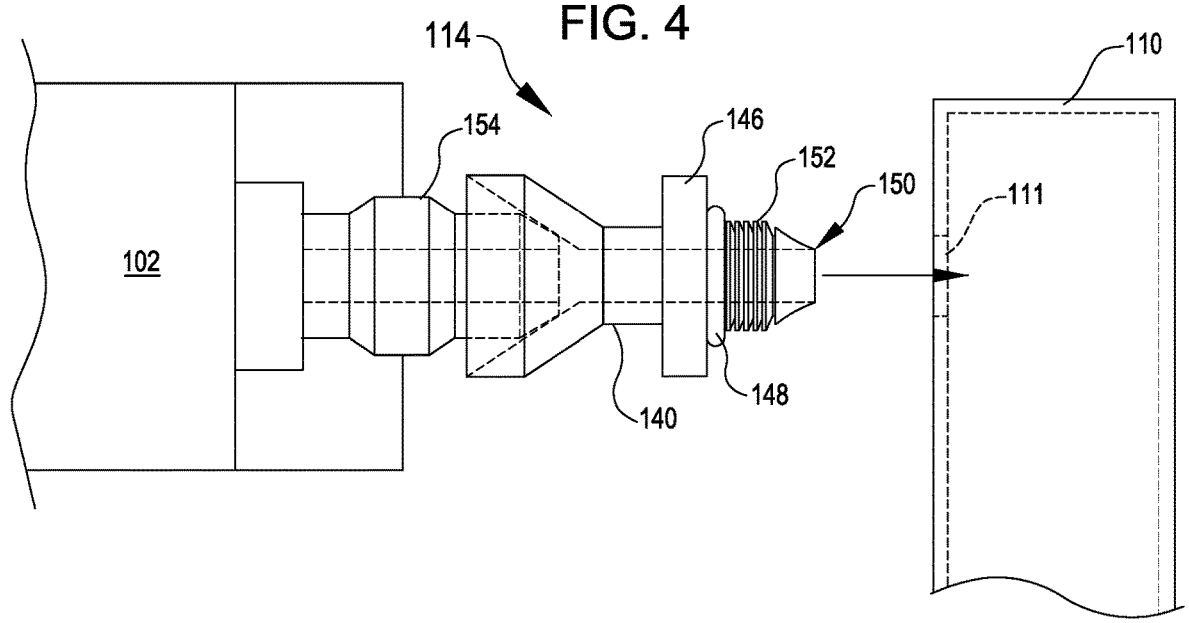
FIG. 4 illustrates a side view of the self-installing connector of FIG. 3 before insertion into the manifold.
Figure 5:
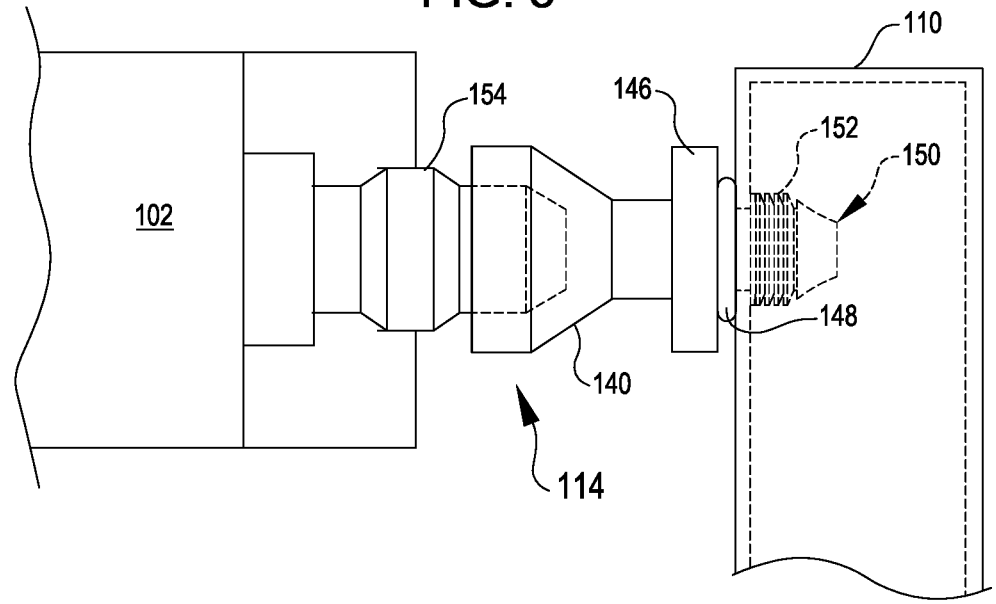
FIG. 5 illustrates a side view of the self-installing connector of FIGS. 3 and 4, advanced so that the self-installing connector is inserted into the manifold.

FIG. 2 illustrates a detail view of a rear portion of the datacenter component rack and components of FIG. 1 showing self-installing connectors 114. As shown in FIG. 2, datacenter electronic component 102 is shown during installation, before being fully seated in its final position. The self-installing connector 114 attached to datacenter electronic component 102 has not yet punctured the manifold 110 and includes both portions of the quick-disconnect coupling (e.g., as shown in FIG. 4). Datacenter electronic component 124 and larger datacenter electronic component 104 are shown in their final installed position on the datacenter component rack 106, and the self-installing connectors 114 for those datacenter electronic components 104 and 124 couple the liquid cooling system 112 to the manifold 110 (e.g., as shown in FIG. 5).

As datacenter electronic component 102 is inserted into a slot of the datacenter component rack 106, the self-installing connector 114 will contact the manifold 110 at a weakened portion 115 of the manifold wall. In some examples, the weakened portion 115 may be circular in shape and include a thinned wall and/or a partial cut-out or notch. The weakened portion 115 may also have other non-circular shapes such as a square, oval, or any other suitable shape to allow the self-installing connector 114 to cut out or knock out the weakened portion 115. The leading edge of the self-installing connector 114 includes a cutting edge configured to puncture the manifold 110 and create an opening into which the self-installing connector 114 will be inserted as the datacenter electronic component 102 is installed. This configuration allows blind-mating of the self-installing connector 114 after installation, in other words, the self-installing connector 114 does not need to be separately connected to the manifold in addition to installing the datacenter electronic component 102 on the datacenter component rack 106. The action of installing the datacenter electronic component 102 into the datacenter component rack 106 simultaneously results in the self-installing connector 114 puncturing the manifold 110 to create an opening and installing the self-installing connector 114 into the newly formed opening, where the manifold coupling 140 of the self-installing connector 114 is retained, forming a quick-disconnect coupling between the datacenter electronic component 102 and the manifold 110.

Figure 3:
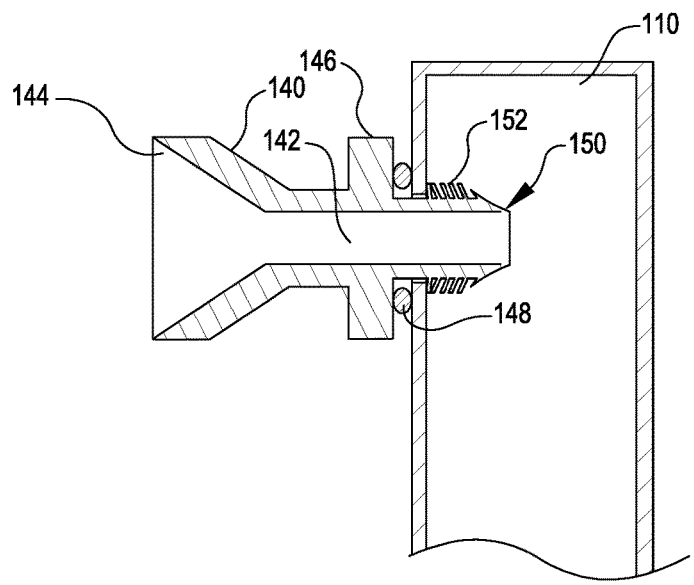
FIG. 3 illustrates a section view of an example self-installing connector inserted into a manifold.

Turning now to FIG. 3, a section view of a self-installing connector inserted into the manifold 110 is shown. The manifold coupling 140 may alternatively be installed on the datacenter electronic component 102, with a component coupling 154, which is a portion of the self-installing connector 114, installed on the manifold 110. The manifold coupling 140 includes a coupling surface 144 which may include a dripless quick-disconnect coupling as described herein. The manifold coupling 140 also includes a seal 148, a cutting edge 150, a retainer 152, and a mounting plate 146. The manifold coupling 140 defines a passage 142 which provides a fluid connection to the liquid cooling system 112 from the manifold 110 when the datacenter electronic component 102 is installed on the datacenter component rack 106.

The self-installing connector 114, including the manifold coupling 140 and the component coupling 154, may be formed of a material matching the material forming the manifold. In some other examples, the self-installing connector 114 is made from a non-corrosive material such as stainless steel. The self-installing connector 114 may, in some other examples, be formed from a nickel plated metal, brass, anodized aluminum, and/or various polymers. The self-installing connector 114, just as the manifolds 110, should be corrosion resistant to extend the life of the liquid coolant system and components thereof.

The cutting edge 150 shows a sharpened edge configured to puncture and/or cut through the manifold 110 to create an opening for the self-installing connector 114. The cutting edge may be configured to match up with a series of weakened portions (not shown) of the manifold 110, such that as the self-installing connector 114 is pressed against the manifold 110, the weakened portion (e.g., a punch-out) may give way to form an opening in the manifold 110. The weakened portion may form a circular shape, or may include a portion of the manifold 110 nearest to the datacenter electronic component 102. The weakened portion may, in some examples, be configured to allow varying placement and/or positioning of the self-installing connector 114 along the height of the manifold 110 to accommodate the varying sizes and placement of datacenter electronic components 102, 104, and 124 as described herein.

As an illustrative example, the manifolds 110 may have a thinner wall on the portion of the manifolds 110 facing the datacenter electronic components 102, 104, and 124 which allows the self-installing connector 114 to puncture the wall of the manifold 110 more easily. Other examples may include a series of grooves and/or incisions made in the manifold 110 along the length of the manifold 110 where the self-installing connector 114 will contact and puncture the manifold 110. The series of grooves may extend through the majority of the thickness of the wall of the manifold 110 such that contact with the self-installing connector 114 results in an inner section surrounded by the grooves being displaced or punched out, forming an opening in the wall of the manifold 110.

In some other examples, the cutting edge 150 may be configured to puncture and deform the manifold 110. For example, the cutting edge 150 may include a sharp point or surface. The cutting edge may also form or cut threads for a threaded connection into the wall of the manifold 110. For example, the cutting edge 150 may include a spring-loaded or otherwise driven element that causes rotation of the thread cutting device as the cutting edge 150 proceeds to puncture and pass through the manifold 110.

The retainer 152 is designed to resist removal of the manifold coupling 140 after insertion into the manifold 110. The retainer 152 is shown as a series of radial barbs which surround the manifold coupling 140 around the portion to be inserted into the manifold 110, including the portion between the cutting edge 150 and the mounting plate 146, which prevents over-insertion of the self-installing connector 114 into the manifold 110. The barbs of the retainer 152 may have a thin fin shape and be angled and/or directed away from the cutting edge 150 such that the retainer 152 will not prevent insertion of the manifold coupling 140 into the manifold 110. After the self-installing connector 114 is inserted into the manifold 110, the retainer prevents removal of the manifold coupling 140 by having the barbs contact the manifold 110 on the inner surface of the manifold and due to the barb shape, spread out if force is applied to remove the manifold coupling 140, preventing removal.

In some examples, the retainer 152 may be a threaded connection, particularly in examples incorporating a thread cutter with the cutting edge 150 as described herein. The manifold coupling 140 may be threaded into the newly cut threads cut by the cutting edge 150 through the use of a pre-tensioned torsion spring or other rotational device.

In some further examples, the retainer may include an adhesive, e.g., an air activated adhesive such as cyanoacrylate adhesive. Other adhesives may also function as a retainer including a two part epoxy, a contact adhesive, or any other suitable adhesive for securing the manifold coupling 140 to the manifold 110. For instance, to be suitable, the adhesive must be compatible with the material forming the manifold 110 and the self-installing connector 114. Other securing devices and methods of securing known to those with skill in the art are anticipated and may be incorporated herein.

The retainer 152 may, in some examples, include radial barbs as described above as well as an adhesive. For example, the radial barbs may have an adhesive disposed in a space between adjacent radial barbs. As the self-installing connector 114 punctures the manifold 110, the barbs of the retainer 152 may compress to insert into the opening formed in the manifold 110. As the barbs compress, the adhesive disposed between the barbs is displaced and/or squeezed out of the inter-barb space. The adhesive may include any of the adhesives described above. In one example, the adhesive may include a two part epoxy, with the two components disposed in adjacent inter-barb spaces. As the barbs are compressed during installation, the two components of the epoxy are squeezed out of the inter-barb space and come into contact with each other, activating the epoxy for adhesion. In at least this example, the adhesive is therefore both activated and applied by the action of installing the datacenter electronic component 102.

FIG. 4 shows a side view of the self-installing connector 114 of FIG. 3 before insertion into the manifold 110. The manifold 110 is shown having a weakened portion 111, though other shapes, configurations, or designs of manifold 110 described herein are suitable. The self-installing connector 114 includes a component coupling 154 and a manifold coupling 140. The component coupling 154 and the manifold coupling 140 form a dripless quick-disconnect coupling. The manifold coupling 140 and the component coupling 154 may be blind-mating connections, i.e., the component coupling 154 and the manifold coupling 140 are engaged upon insertion of the datacenter electronic component 102 into the datacenter component rack 106. The quick-disconnect coupling may be of any type or variety available, including but not limited to a non-latching coupling, a double shut-off, single shut-off, and/or dripless connections. Those with skill in the art will appreciate the broad scope and availability of quick-disconnect couplings and therefore this description is intended to incorporate such couplings.

In some examples, a flat-faced coupling may be incorporated into the self-installing connector 114. Flat-faced couplings can virtually eliminate spillage by limiting leakage to a drop of fluid or less upon disconnection. The flat mating surfaces are also easy to keep clean, which prevents contaminating coolant reconnection. Flat-face, no-spill couplings, often include a poppet-style shutoff valve on each mating half. Most limit leakage during uncoupling to only a drop or less on the coupling's mating surfaces and prevent air ingression during coupling. They are also designed for minimum flow restriction, which minimizes pressure drop during equipment operation. In some examples, the poppet-style shutoff may be incorporated or included with other types of couplings, including non-latching couplings. Non-latching couplings are typically used in applications where quick serviceability in a compact space is required. Typically, a non-latching quick disconnect will be selected when a portion of the device requires frequent change out, when the releasing sleeve of a latching coupling may be inaccessible. Often these couplings are equipped with self-sealing valves so that upon disconnection they will automatically contain the fluid in at least one of the lines. Snap type quick disconnects are commonly specified with no shut-off, a single shut-off, double shut-off, or as a dry break.

The manifold coupling 140 may include a seal 148 or O-ring to prevent leaks or coolant loss around the opening formed in the manifold 110. The quick-disconnect coupling may also incorporate sealing materials, such as O-ring seals. Buna (also known as Buna-N or Nitrile) offers compatibility with the majority of coolant types. In some other examples, ethylene propylene diene monomer rubber (EPDM), Viton®, Silicone and Perfluoroelastomers (such as Chemraz® and Kalrez®) may be incorporated. The mounting plate 146 may provide a surface against which the seal 148 may press to seal the opening in the manifold 110. In some other examples, the seal 148 may be replaced, either partially or wholly, by an adhesive such as epoxy used to retain the manifold coupling 140 in the manifold 110.

FIG. 5 shows a side view of the self-installing connector 114 of FIGS. 3 and 4, advanced so that the self-installing connector 114 is inserted into the manifold 110. The self-installing connector 114, including the manifold coupling 140 and the component coupling 154, is coupled to the datacenter electronic component 102 and the liquid cooling system 112. The self-installing connector 114 is further coupled to the manifold 110. The self-installing connector 114 provides fluid communication between the manifold 110 and the liquid cooling system 112.

In some examples, as the self-installing connector 114 punctures the manifold 110, it may knock out a punch-out portion of the manifold 110 as described above. The punch-out, or debris that is produced as a result of the installation of the self-installing connector 114 may be loose inside the manifold 110. The debris may need to be removed from the manifold 110 before operation commences to prevent plugging portions of the liquid cooling system 112, self-installing connectors 114, or other portions of the system resulting in malfunctions. The manifold 110 may therefore include a clean-out or debris trap at a lower end of the manifold 110 into which the debris may settle and be removed. The manifold 110 may also include a gas purge vent or valve at an upper end to remove air from the manifolds 110 that may be introduced during installation and may interfere with operation of the liquid cooling system 112.

In some examples, the liquid cooling system 112 may also include a liquid connection notification system (not shown). The liquid connection notification system may include liquid and/or coolant sensors such as conductive sensor and/or moisture sensors such that when a successful fluid connection is formed between the manifold 110 and the liquid cooling system 112, a notification such as a light or audible tone is generated indicating the connection to the liquid cooling system 112 is successful. The notification system may prevent instances where the datacenter electronic component 102 is installed in a datacenter component rack 106 but is installed incorrectly or there is a malfunction in the liquid cooling system 112 but the installer is unaware until the datacenter electronic component 102 overheats in operation, resulting in damage to the datacenter electronic component 102 and potentially to additional adjacent units.

In some examples, the self-installing connector 114 may provide a notification that it is properly installed and/or fully seated in the manifold 110. For example, the self-installing connector 114 may provide an audible click or tone to indicate to an installer that the datacenter electronic component 102 is fully seated and the self-installing connector 114 is fully seated in the manifold 110 to provide a leak-free fluid connection between the liquid cooling system 112 and the manifold 110.

In some further examples, the datacenter component rack system 100 includes telemetry and/or pressure sensors to provide readings of pressure levels within the manifolds 110. The telemetry may be configured to interface with a cooling control system which lowers the pressure within the manifolds 110 to allow installation of the datacenter electronic components 102, 104, and 124 using the self-installing connector 114 with a decreased risk of coolant leaks at the point in time the self-installing connector 114 punctures the manifold 110.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Figure 6:
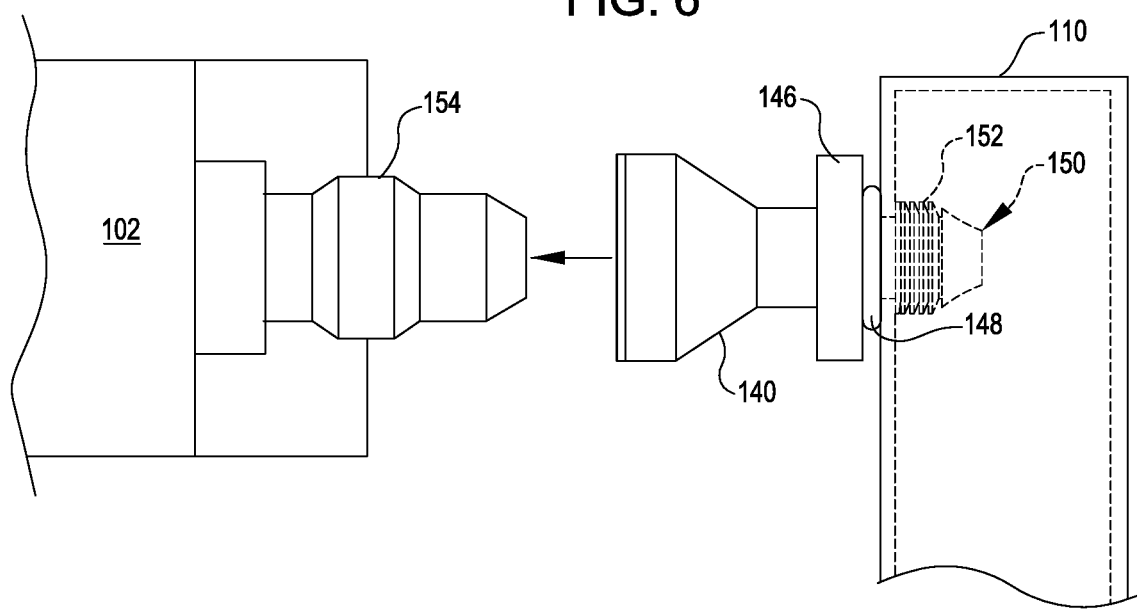
FIG. 6 illustrates a side view of the self-installing connector of FIG. 5, with a component coupling retracted so that the manifold coupling is disconnected at a quick-disconnect connector after insertion into a manifold.

FIG. 6 illustrates a side view of the self-installing connector 114 of FIG. 5, with a component coupling 154 retracted so that the manifold coupling 140 is disconnected at a quick-disconnect connector after insertion into the manifold 110. The component coupling 154 and the manifold coupling 140 connect using a blind-mate quick-disconnect coupling as described herein. After the self-installing connector 114 is installed, with the manifold coupling 140 secured in the manifold 110, the datacenter electronic component 102 may be removed for maintenance and/or other purposes such as replacement. Upon removal of the datacenter electronic component 102, the quick-disconnect joint between the manifold coupling 140 and the component coupling 154 separates, disconnecting the fluid communication between the manifold 110 and the liquid cooling system 112. The retainer 152 resists removal of the manifold coupling 140 from the manifold 110, ensuring the disconnection occurs at the quick-disconnect joint. Upon re-insertion of the datacenter electronic component 102 into the datacenter component rack 106, the component coupling 154 will automatically re-connect with the manifold coupling 140 at the blind-mate quick-disconnect joint, which may also be a dripless connection as described above.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A datacenter component rack system, comprising:
    a datacenter component rack having slots configured to receive electronic datacenter components at locations along a height of the datacenter component rack;
    a liquid cooling system, comprising:
        a delivery manifold disposed along the height of the datacenter component rack and configured to deliver liquid for cooling the electronic datacenter components;
        a return manifold disposed along the height of the datacenter component rack, configured to receive liquid from the electronic datacenter components; and
    an electronic datacenter component installed in the rack and comprising:
        a first self-installing connector that secures a manifold coupling of the first self-installing connector to the delivery manifold and establishes a fluid connection between the delivery manifold and the manifold coupling of the first self-installing connector when the electronic datacenter component is inserted into the rack; and
        a second self-installing connector that secures a manifold coupling of the second self-installing connector to the return manifold and establishes a fluid connection between the return manifold and the manifold coupling of the second self-installing connector when the electronic datacenter component is inserted into the datacenter component rack.

2. The datacenter component rack system of claim 1, wherein:
    the delivery manifold comprises a weakened portion; and
    the first self-installing connector pierced the delivery manifold upon installation by displacing the weakened portion of the delivery manifold to form an opening in the delivery manifold.

3. The datacenter component rack system of claim 2, wherein the first self-installing connector comprises:
    a quick-disconnect connection between the manifold coupling and a component coupling of the first self-installing connector.

4. The datacenter component rack system of claim 2, wherein the first self-installing connector comprises:
    a retainer configured to retain the manifold coupling of the first self-installing connector in the opening in the delivery manifold.

5. The datacenter component rack system of claim 4, wherein the retainer comprises:
    a barb configured to retain the manifold coupling of the first self-installing connector in the opening in the delivery manifold.

6. A system, comprising:
a component rack having a slot configured to receive an electronic component at a location along a height of the component rack; and
a liquid cooling system comprising:
- a delivery manifold disposed along the height of the component rack and configured to be coupled to a heat exchanger, the delivery manifold having a weakened portion of a wall of the delivery manifold being configured to be punctured by and receive a first self-installing connector from the electronic component at the location along the height of the component rack; and
- a return manifold disposed along the height of the component rack and configured to be coupled to the heat exchanger, the return manifold having a weakened portion of a wall of the return manifold being configured to be punctured by and receive a second self-installing connector from the electronic component at the location along the height of the component rack.

7. The system of claim 6, wherein the weakened portion of the wall of each of the delivery manifold and the return manifold comprises:
a respective a punch-out section configured to be displaced by the self-installing connector when the self-installing connector punctures the wall.

8. The system of claim 6, wherein:
the first and second self-installing connectors couple the electronic component to the delivery manifold and the return manifold, respectively, when the electronic component is inserted into the slot of the component rack.

9. The system of claim 8, wherein:
each of the first and second self-installing connectors comprises a respective quick-disconnect coupling between a respective component coupling and a respective manifold coupling.

10. The system of claim 9, wherein:
for each of the first and second self-installing connectors, the manifold coupling and the component coupling of the self-installing connector are coupled when the electronic component is inserted into the slot of the component rack;
the manifold coupling of the first self-installing connector punctures the delivery manifold when the electronic component is inserted into the slot of the component rack; and
the manifold coupling of the second self-installing connector punctures the return manifold when the electronic component is inserted into the slot of the component rack.

11. The system of claim 6, wherein:
the delivery manifold comprises a sealable opening at a bottom end of the delivery manifold configured to allow cleaning of the delivery manifold.

12. The system of claim 6, wherein:
the liquid cooling system comprises a leak-free fluid connection indicator configured to provide a notification that a leak-free fluid connection exists between the liquid cooling system and the electronic component.

13. A system comprising:
an electronic component having at least part of a liquid cooling system;
a self-installing connector coupled to a rear side of the electronic component, the self-installing connector comprising:
- a component coupling connected to the electronic component and comprising a first quick-disconnect coupler;
- a manifold coupling comprising:
  - a second quick-disconnect coupler connected to the first quick-disconnect coupler;
  - a cutting edge configured to puncture a liquid cooling manifold of a component rack as the electronic component is inserted into the component rack; and
  - a retainer configured to retain the manifold coupling of the self-installing connector in the liquid cooling manifold.

14. The system of claim 13, wherein:
the retainer comprises barbs configured to resist removal of the manifold coupling of the self-installing connector from the liquid cooling manifold.

15. The system of claim 14, wherein:
the retainer further comprises an adhesive disposed between adjacent barbs configured to be displaced as the self-installing connector is installed in the liquid cooling manifold and secure the manifold coupling to the liquid cooling manifold.

16. The system of claim 13, wherein:
the retainer comprises an adhesive configured to bond the manifold coupling of the self-installing connector to the liquid cooling manifold.

17. The system of claim 13, wherein:
the cutting edge comprises a thread cutting device configured to puncture the liquid cooling manifold and cut threads therein.

18. The system of claim 13, wherein:
the retainer comprises a threaded connection.

19. The system of claim 13, wherein:
the self-installing connector further comprises a removable clip configured to retain the manifold coupling with the component coupling until the electronic component is inserted into the component rack.

* * * * *

UNITED STATES PATENT AND TRADEMARK OFFICE
CERTIFICATE OF CORRECTION

PATENT NO. : 10,701,838 B1
APPLICATION NO. : 16/363165
DATED : June 30, 2020
INVENTOR(S) : Ryan F. Conroy, Felipe Enrique Ortega Gutierrez and Luke Thomas Gregory It is certified that error appears in the above-identified patent and that said Letters Patent is hereby corrected as shown below:

In the Claims

Column 11, Line 26, Claim 7:
Delete: "a respective a punch-out section configured to be dis-"
Insert -- a respective punch-out section configured to be dis- --

Signed and Sealed this
Thirteenth Day of October, 2020

Andrei Iancu
*Director of the United States Patent and Trademark Office*